United States Patent
Lu et al.

(10) Patent No.: US 10,139,479 B2
(45) Date of Patent: Nov. 27, 2018

(54) SUPERPIXEL ARRAY OF PIEZOELECTRIC ULTRASONIC TRANSDUCERS FOR 2-D BEAMFORMING

(71) Applicant: QUALCOMM Incorporated, San Diego, CA (US)

(72) Inventors: Yipeng Lu, Davis, CA (US); Hao-Yen Tang, Berkeley, CA (US); Hrishikesh Vijaykumar Panchawagh, San Jose, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 94 days.

(21) Appl. No.: 14/883,586

(22) Filed: Oct. 14, 2015

(65) Prior Publication Data
US 2016/0132187 A1    May 12, 2016

Related U.S. Application Data

(60) Provisional application No. 62/064,416, filed on Oct. 15, 2014, provisional application No. 62/064,417, (Continued)

(51) Int. Cl.
*G06F 3/043* (2006.01)
*G01S 7/52* (2006.01)
(Continued)

(52) U.S. Cl.
CPC .......... *G01S 7/5208* (2013.01); *B06B 1/0207* (2013.01); *B06B 1/0607* (2013.01); (Continued)

(58) Field of Classification Search
CPC .... G06F 3/0436; G06F 3/0416; G06F 3/0412; G06F 2203/04101; G01S 7/5208; (Continued)

(56) References Cited

U.S. PATENT DOCUMENTS 3,800,270 A    3/1974  Bailey
4,307,613 A  * 12/1981  Fox ..................... G01N 29/262
                                                    367/105
(Continued)

FOREIGN PATENT DOCUMENTS

DE    3940808 A1    6/1991
GB    2511556 A     9/2014
(Continued)

OTHER PUBLICATIONS

U.S. Appl. No. 15/292,057, filed Oct. 12, 2016, Panchawagh; Hrishikesh Vijaykumar et al.
(Continued)

*Primary Examiner* — Brent D Castiaux
(74) *Attorney, Agent, or Firm* — Weaver Austin Villeneuve & Sampson LLP QUAL

(57) ABSTRACT

An array of piezoelectric ultrasonic transducer elements includes a plurality of superpixel regions. Each superpixel region includes at least two pixel sets, a first pixel set of the at least two pixel sets being disposed in a central portion of the superpixel region, and at least a second pixel set being disposed in an outer portion of the superpixel region. An electrical coupling may be provided between the array and transceiver electronics. The transceiver electronics may be configured to operate the array in a selectable one of a first mode and a second mode. In the first mode, the array generates a substantially plane ultrasonic wave having a first acoustic pressure. In the second mode, the array generates, from each superpixel region, a focused beam having a second acoustic pressure that is substantially higher than the first acoustic pressure.

22 Claims, 10 Drawing Sheets

Detail C

Detail D

Related U.S. Application Data filed on Oct. 15, 2014, provisional application No. 62/064,418, filed on Oct. 15, 2014.

(51) Int. Cl.

| | | |
|---|---|---|
| *B06B 1/06* | (2006.01) | |
| *H01L 41/047* | (2006.01) | |
| *G10K 11/34* | (2006.01) | |
| *G06F 3/041* | (2006.01) | |
| *G06K 9/00* | (2006.01) | |
| *G10K 11/26* | (2006.01) | |
| *G01S 7/521* | (2006.01) | |
| *G01S 15/04* | (2006.01) | |
| *G01S 15/89* | (2006.01) | |
| *H01L 41/08* | (2006.01) | |
| *B06B 1/02* | (2006.01) | |

(52) U.S. Cl.
CPC .......... *B06B 1/0644* (2013.01); *B06B 1/0666* (2013.01); *G01S 7/521* (2013.01); *G01S 15/04* (2013.01); *G01S 15/89* (2013.01); *G01S 15/8915* (2013.01); *G06F 3/0412* (2013.01); *G06F 3/0416* (2013.01); *G06F 3/0436* (2013.01); *G06K 9/0002* (2013.01); *G06K 9/00335* (2013.01); *G10K 11/26* (2013.01); *G10K 11/34* (2013.01); *G10K 11/346* (2013.01); *H01L 41/047* (2013.01); *H01L 41/08* (2013.01); *B06B 2201/20* (2013.01); *B06B 2201/55* (2013.01); *G06F 2203/04101* (2013.01); *G10K 11/341* (2013.01)

(58) Field of Classification Search
CPC ...... G01S 7/521; G01S 15/8915; G01S 15/89; G01S 15/04; H01L 41/08; H01L 41/047; B06B 1/0666; B06B 1/0644; G10K 11/26; G10K 11/34; G10K 11/341; G06K 9/0002; G06K 9/00335
See application file for complete search history.

(56) References Cited

U.S. PATENT DOCUMENTS

| | | | |
|---|---|---|---|
| 4,523,471 A | 6/1985 | Lee | |
| 5,744,898 A | 4/1998 | Smith et al. | |
| 6,383,141 B1* | 5/2002 | Itoi | A61B 8/12 600/459 |
| 6,736,779 B1* | 5/2004 | Sano | A61B 8/00 600/447 |
| 8,203,912 B2 | 6/2012 | Roest et al. | |
| 8,760,971 B2 | 6/2014 | Karl | |
| 8,958,610 B2 | 2/2015 | McNulty | |
| 9,995,821 B2 | 6/2018 | Tang et al. | |
| 2004/0267134 A1 | 12/2004 | Hossack et al. | |
| 2005/0023937 A1 | 2/2005 | Sashida et al. | |
| 2005/0041498 A1 | 2/2005 | Resta et al. | |
| 2005/0057284 A1* | 3/2005 | Wodnicki | A61B 8/13 327/100 |
| 2005/0075572 A1 | 4/2005 | Mills et al. | |
| 2005/0146247 A1 | 7/2005 | Fisher et al. | |
| 2005/0219212 A1 | 10/2005 | Koll et al. | |
| 2006/0164919 A1 | 7/2006 | Watanabe et al. | |
| 2008/0110266 A1* | 5/2008 | Randall | G10K 11/341 73/661 |
| 2008/0122317 A1 | 5/2008 | Fazzio et al. | |
| 2008/0258580 A1 | 10/2008 | Schneider et al. | |
| 2008/0309200 A1 | 12/2008 | Melandso et al. | |
| 2009/0204001 A1 | 8/2009 | Ona et al. | |
| 2010/0106431 A1 | 4/2010 | Baba et al. | |
| 2010/0168583 A1 | 7/2010 | Dausch et al. | |
| 2011/0215150 A1 | 9/2011 | Schneider et al. | |
| 2012/0188849 A1 | 7/2012 | Matsuda et al. | |
| 2012/0206014 A1* | 8/2012 | Bibl | B06B 1/0644 310/331 |
| 2012/0245408 A1 | 9/2012 | Shen et al. | |
| 2013/0134838 A1 | 5/2013 | Yun et al. | |
| 2013/0258805 A1 | 10/2013 | Hansen et al. | |
| 2013/0286778 A1 | 10/2013 | Kisner et al. | |
| 2013/0293065 A1 | 11/2013 | Hajati et al. | |
| 2014/0219521 A1* | 8/2014 | Schmitt | G06K 9/0002 382/124 |
| 2014/0232241 A1 | 8/2014 | Hajati | |
| 2014/0243676 A1 | 8/2014 | Cogan et al. | |
| 2014/0354608 A1 | 12/2014 | Kitchens, II et al. | |
| 2015/0020608 A1 | 1/2015 | Chevrier et al. | |
| 2015/0087991 A1 | 3/2015 | Chen et al. | |
| 2015/0165479 A1 | 6/2015 | Lasiter et al. | |
| 2015/0169136 A1 | 6/2015 | Ganti et al. | |
| 2015/0198699 A1 | 7/2015 | Kuo et al. | |
| 2015/0346903 A1 | 12/2015 | O'Connor | |
| 2015/0357375 A1 | 12/2015 | Tsai et al. | |
| 2016/0107194 A1 | 4/2016 | Panchawagh et al. | |
| 2016/0131747 A1 | 5/2016 | Tang et al. | |
| 2017/0110504 A1 | 4/2017 | Panchawagh et al. | |

FOREIGN PATENT DOCUMENTS

| | | |
|---|---|---|
| JP | 2013135793 A | 7/2013 |
| WO | 2014108960 A1 | 7/2014 |
| WO | 2015086413 A1 | 6/2015 |
| WO | 2016061406 A1 | 4/2016 |
| WO | 2016061410 A1 | 4/2016 |
| WO | 2016061412 A1 | 4/2016 |
| WO | PCT/US16/57104 | 10/2016 |
| WO | WO 2017066612 A1 | 4/2017 |

OTHER PUBLICATIONS

International Search Report and Written Opinion—PCT/US2015/055825—ISA/EPO—dated Feb. 8, 2016.
Second Written Opinion of the International Preliminary Examining Authority—PCT/US2015/055825—ISA/EPO—dated Sep. 26, 2016.
International Search Report and Written Opinion—PCT/US2015/055827—ISA/EPO—dated Feb. 4, 2016.
Second Written Opinion of the International Preliminary Examining Authority—PCT/US2015/055827—ISA/EPO—dated Sep. 26, 2016.
International Search Report and Written Opinion—PCT/US2015/055821—ISA/EPO—dated Feb. 4, 2016.
Second Written Opinion of the International Preliminary Examining Authority—PCT/US2015/055821—ISA/EPO—dated Sep. 26, 2016.
International Preliminary Report on Patentability—PCT/US2015/055825—ISA/EPO—dated Feb. 3, 2017.
International Preliminary Report on Patentability—PCT/US2015/055827—ISA/EPO—Feb. 3, 2017.
International Preliminary Report on Patentability—PCT/US2015/055821—ISA/EPO—dated Feb. 3, 2017.
International Search Report and Written Opinion—PCT/US2016/57104—ISA/EPO—dated Jan. 23, 2017.
U.S. Office Action dated Sep. 1, 2017, issued in U.S. Appl. No. 14/883,585.
U.S. Notice of Allowance dated Jan. 16, 2018, issued in U.S. Appl. No. 14/883,585.
U.S. Supplemental Notice of Allowance dated Jan. 29, 2018, issued in U.S. Appl. No. 14/883,585.
U.S. Corrected Notice of Allowance dated Feb. 9, 2018, issued in U.S. Appl. No. 14/883,585.
U.S. Appl. No. 10/001,552, filed Jun. 19, 2018, Panchawagh et al.
U.S. Notice of Allowance dated Apr. 12, 2018, issued in U.S. Appl. No. 14/883,583.
U.S. Supplemental Notice of Allowance dated May 18, 2018, issued in U.S. Appl. No. 14/883,585.
International Preliminary Report on Patentability dated Apr. 26, 2018, issued in Application No. PCT/US2016/057104.

* cited by examiner

Detail L

Detail K

Detail J

SUPERPIXEL ARRAY OF PIEZOELECTRIC ULTRASONIC TRANSDUCERS FOR 2-D BEAMFORMING

CROSS-REFERENCE TO RELATED APPLICATIONS

This disclosure claims priority to U.S. Provisional Patent Application No. 62/064,416, filed on Oct. 15, 2014, entitled "THREE-PORT PIEZOELECTRIC ULTRASONIC TRANSDUCER," to Provisional Patent Application No. 62/064,417, filed on Oct. 15, 2014 and entitled "ACTIVE BEAM-FORMING TECHNIQUE FOR PIEZOELECTRIC ULTRASONIC TRANSDUCER ARRAY," to Provisional Patent Application No. 62/064,418, filed on Oct. 15, 2014 and entitled "SUPERPIXEL ARRAY OF PIEZOELECTRIC ULTRASONIC TRANSDUCERS FOR 2-D BEAMFORMING," which are hereby incorporated by reference. Provisional Patent Application No. 62/241,651, filed on Oct. 14, 2015 and entitled "INTEGRATED PIEZOELECTRIC MICROMECHANICAL ULTRASONIC TRANSDUCER PIXEL AND READOUT," is hereby incorporated by reference.

TECHNICAL FIELD

This disclosure relates to an array of piezoelectric ultrasonic transducers for imaging and liveness determination, and more particularly to techniques for configuring portions of the array as superpixels for two-dimensional (2-D) beamforming.

DESCRIPTION OF THE RELATED TECHNOLOGY

Thin film piezoelectric acoustic transducers are attractive candidates for numerous applications including biometric sensors such as fingerprint sensors, gesture detection, microphones and speakers, ultrasonic imaging, and chemical sensors. Such transducers may include piezoelectric micromechanical ultrasonic transducers (PMUTs) configured as a multilayer stack that includes a piezoelectric layer stack and a mechanical layer disposed over a cavity. The piezoelectric layer stack may include a layer of piezoelectric material. On or proximate to each of an upper and a lower surface of the piezoelectric layer, a respective upper and lower electrode layer may be disposed. The electrode layers may be patterned or unpatterned.

The assignee of the present disclosure has developed biometric sensors that include an array of PMUTs, each PMUT in the array corresponding to an individual pixel of a rendered image of, for example, a fingerprint. Normally, the PMUTs may be actuated approximately simultaneously, a technique that may be referred to as plane wave excitation. FIG. 1A illustrates an example of plane wave excitation in which each PMUT in an array 100 emits ultrasonic energy with substantially the same timing and phase of ultrasonic emissions originating from neighboring PMUTs. As illustrated in Detail A, the aggregate ultrasonic signal approximates a plane wave. The acoustic pressure for such a plane wave is fairly uniform with respect to position across the PMUT array (Detail B).

A pixel array operating in a plane wave excitation and transmission mode has been shown to produce sufficient average acoustic pressure to provide a fingerprint image resolution on the order of 500 dpi (dots per inch).

SUMMARY

The systems, methods and devices of this disclosure each have several innovative aspects, no single one of which is solely responsible for the desirable attributes disclosed herein.

One innovative aspect of the subject matter described in this disclosure relates to an apparatus including transceiver electronics and an array of piezoelectric ultrasonic transducer elements, the array including a plurality of superpixel regions, each superpixel region including at least two pixel sets, a first pixel set of the at least two pixel sets being disposed in a central portion of the superpixel region, and at least a second pixel set being disposed in an outer portion of the superpixel region, and an electrical coupling between the transceiver electronics and the array. The transceiver electronics may be configured to operate the array in a selectable one of a first mode and a second mode. In the first mode, the array generates a substantially plane ultrasonic wave having a first acoustic pressure. In the second mode, the array generates, from each superpixel region, a focused beam having a second acoustic pressure that is substantially higher than the first acoustic pressure.

In some examples, the electrical coupling between the transceiver electronics and the array may include a first fixedly configured conductive path connecting pixels in the first pixel set with a first drive input terminal and a second fixedly configured conductive path connecting pixels in the second pixel set with a second drive input terminal, the first drive input terminal and the second drive input terminal being coupled with the transceiver electronics. In some examples, in the first mode, the transceiver electronics may concurrently transmit signals to each of the first drive input terminal and the second drive input terminal, and in the second mode, the transceiver electronics may sequentially transmits signals to each of the first drive input terminal and the second drive input terminal such that a time delay occurs between delivery of a first transmission signal to the second drive input terminal and delivery of a second transmission signal to the first drive input terminal.

In some examples, the superpixel region may include seven pixels arranged on a hexagonal lattice so as to form a hexagon, the first pixel set may include one center pixel disposed proximate to a center of the hexagon; and the second pixel set may include six pixels, each disposed in the outer portion of the superpixel region approximately equidistant from the center pixel.

In some examples, the apparatus may further include a third pixel set and a fourth pixel set. The superpixel region may include nineteen pixels arranged on a hexagonal lattice so as to form a hexagon. The first pixel set may include one center pixel disposed proximate to a center of the hexagon. The second pixel set may include six pixels disposed in an outer portion of the superpixel region approximately equidistant from the center pixel. The third pixel set may include six pixels, each disposed at a greater distance from the center pixel than each pixel in the second pixel set and at a lesser distance from the center pixel than each pixel in the fourth pixel set. In some examples, the electrical coupling between the transceiver electronics and the array may include a first fixedly configured conductive path connecting pixels in the first pixel set with a first drive input terminal, a second fixedly configured conductive path connecting pixels in the second pixel set with a second drive input terminal, a third fixedly configured conductive path connecting pixels in the third pixel set with a third drive input terminal, and a fourth fixedly configured conductive path connecting pixels in the fourth pixel set with a fourth drive input terminal. Each of the first drive input terminal, the second drive input, the third drive input, and the fourth drive input may be coupled with the transceiver electronics. In some examples, in the first mode, the transceiver electronics may concurrently transmit signals to each of the first drive input terminal, the second drive input terminal, the third drive input terminal, and the fourth drive input terminal and, in the second mode, the transceiver electronics may sequentially transmit signals to each of the first drive input terminal, the second drive input terminal, the third drive input terminal, and the fourth drive input terminal, such that: a first time delay occurs between delivery of a first transmission signal to the fourth drive input terminal and delivery of a second transmission signal to the third drive input terminal; a second time delay occurs between delivery of the second transmission signal to the third drive input terminal and delivery of a third transmission signal to the second drive input terminal; and a third time delay occurs between delivery of the third transmission signal to the third drive input terminal and delivery of a fourth transmission signal to the first drive input terminal.

In some examples, the apparatus may further include a third pixel set, wherein the superpixel region includes nine pixels arranged along orthogonal rows and columns so as to form a square. The first pixel set may include one center pixel; the second pixel set may include four pixels, each disposed in the outer portion of the superpixel region approximately equidistant from the center pixel; and the third pixel set may include four pixels, each disposed in the outer portion of the superpixel region approximately equidistant from the center pixel, at a greater distance from the center pixel than each pixel of the second pixel set. In some examples, the electrical coupling between the transceiver electronics and the array may include a first fixedly configured conductive path connecting pixels in the first pixel set with a first drive input terminal, a second fixedly configured conductive path connecting pixels in the second pixel set with a second drive input terminal; and a third fixedly configured conductive path connecting pixels in the third pixel set with a third drive input terminal. Each of the first drive input terminal, the second drive input, and the third drive input may be coupled with the transceiver electronics. In some examples, in the first mode, the transceiver electronics may concurrently transmit signals to each of the first drive input terminal, the second drive input terminal, and the third drive input terminal; and in the second mode, the transceiver electronics may sequentially transmit signals to each of the first drive input terminal, the second drive input terminal, and the third drive input terminal, such that: a first time delay occurs between delivery of a first transmission signal to the third drive input terminal and delivery of a second transmission signal to the second drive input terminal; and a second time delay occurs between delivery of the second transmission signal to the second drive input terminal and delivery of a third transmission signal to the first drive input terminal.

In some examples, the apparatus may further include a platen and an acoustic coupling medium disposed above the array, wherein the array is configured to receive or transmit ultrasonic signals through the platen and the coupling medium.

According to some implementations, a method includes operating an array of piezoelectric ultrasonic transducer elements in a selectable one of a first mode and a second mode, the array including a plurality of superpixel regions, each superpixel region including at least two pixel sets, a first pixel set of the at least two pixel sets being disposed in a central portion of the superpixel region, and at least a second pixel set being disposed in an outer portion of the superpixel region, the array having an electrical coupling with transceiver electronics. In the first mode, operating the array generates a substantially plane ultrasonic wave having a first acoustic pressure; and in the second mode, operating the array generates, from each superpixel region, a focused beam having a second acoustic pressure that is substantially higher than the first acoustic pressure.

In some examples, the electrical coupling between the transceiver electronics and the array may include a first fixedly configured conductive path connecting pixels in the first pixel set with a first drive input terminal and a second fixedly configured conductive path connecting pixels in the second pixel set with a second drive input terminal, the first drive input terminal and the second drive input terminal being coupled with the transceiver electronics. In some examples, in the first mode, the transceiver electronics may concurrently transmit signals to each of the first drive input terminal and the second drive input terminal; and in the second mode, the transceiver electronics may sequentially transmit signals to each of the first drive input terminal and the second drive input terminal such that a time delay occurs between delivery of a first transmission signal to the second drive input terminal and delivery of a second transmission signal to the first drive input terminal.

According to some implementations, an apparatus includes means for operating an array of piezoelectric ultrasonic transducer elements in a selectable one of a first mode and a second mode, the array including a plurality of superpixel regions, each superpixel region including at least two pixel sets, a first pixel set of the at least two pixel sets being disposed in a central portion of the superpixel region, and at least a second pixel set being disposed in an outer portion of the superpixel region. Operating the array of piezoelectric ultrasonic transducer elements includes: in the first mode, controlling the array to generate a substantially plane ultrasonic wave having a first acoustic pressure; and in the second mode, controlling the array to generate, from each superpixel region, a focused beam having a second acoustic pressure that is substantially higher than the first acoustic pressure.

In some examples, the means for operating the array may have an electrical coupling with a first drive input terminal and a second drive input terminal of the array, the electrical coupling including a first fixedly configured conductive path connecting pixels in the first pixel set with the first drive input terminal and a second fixedly configured conductive path connecting pixels in the second pixel set with the second drive input terminal.

According to some implementations, in non-transitory computer readable medium having software stored thereon, the software includes instructions for causing an apparatus to: operate an array of piezoelectric ultrasonic transducer elements in a selectable one of a first mode and a second mode, the array including a plurality of superpixel regions, each superpixel region including at least two pixel sets, a first pixel set of the at least two pixel sets being disposed in a central portion of the superpixel region, and at least a second pixel set being disposed in an outer portion of the superpixel region, the array having an electrical coupling with transceiver electronics. In the first mode, the array generates a substantially plane ultrasonic wave having a first acoustic pressure. In the second mode, the array generates, from each superpixel region, a focused beam having a second acoustic pressure that is substantially higher than the first acoustic pressure.

BRIEF DESCRIPTION OF THE DRAWINGS

Details of one or more implementations of the subject matter described in this specification are set forth in this disclosure and the accompanying drawings. Other features, aspects, and advantages will become apparent from a review of the disclosure. Note that the relative dimensions of the drawings and other diagrams of this disclosure may not be drawn to scale. The sizes, thicknesses, arrangements, materials, etc., shown and described in this disclosure are made only by way of example and should not be construed as limiting. Like reference numbers and designations in the various drawings indicate like elements.

DETAILED DESCRIPTION

Figure 1A:
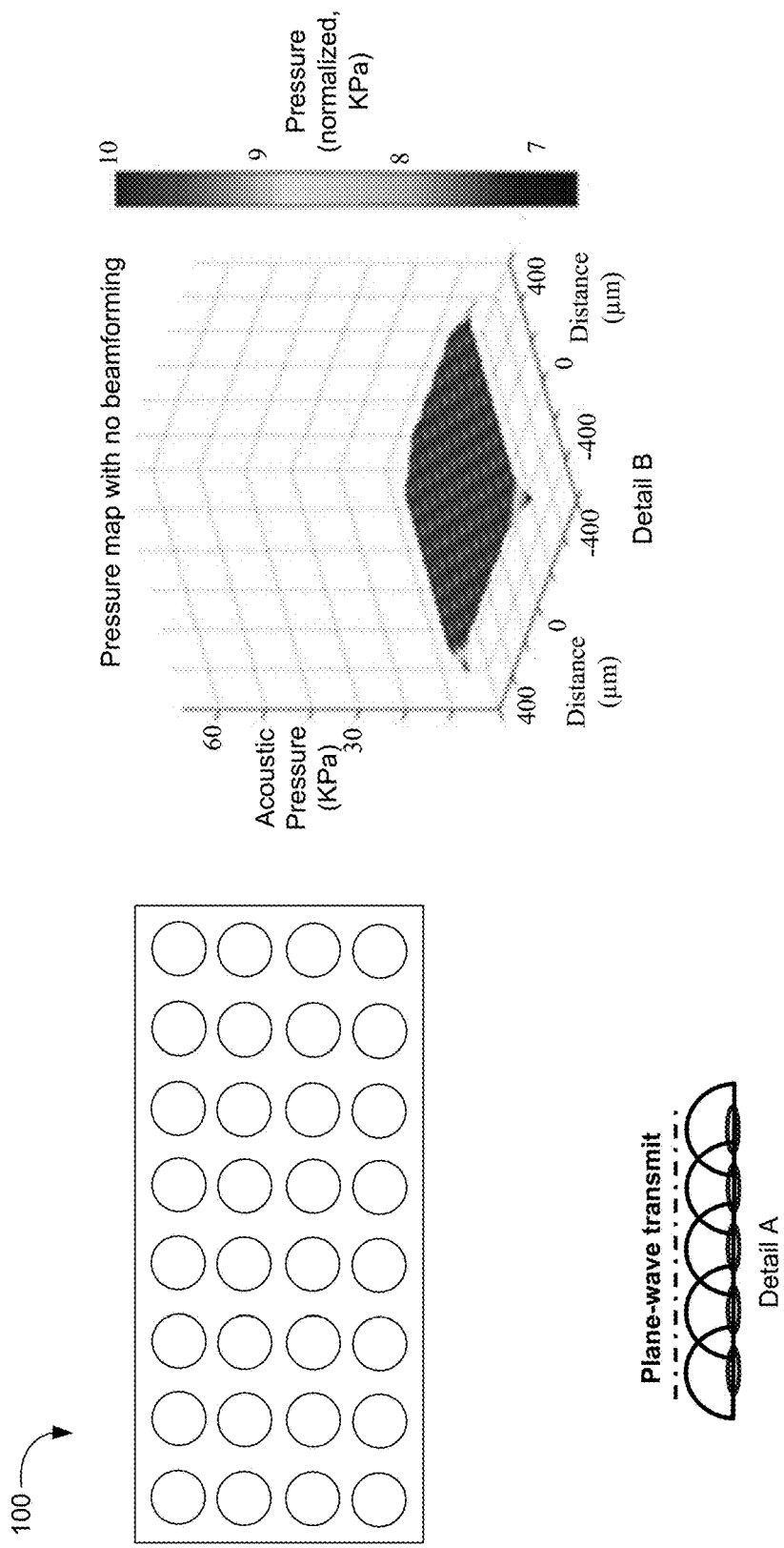
FIG. 1A illustrates an example of plane wave excitation.

The following description is directed to certain implementations for the purposes of describing the innovative aspects of this disclosure. However, a person having ordinary skill in the art will readily recognize that the teachings herein may be applied in a multitude of different ways. The described implementations may be implemented in any device, apparatus, or system that includes an ultrasonic sensor or emitter. For example, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, handwriting digitizers, fingerprint detectors, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), mobile health devices, computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also may be used in applications such as, but not limited to, electronic switching devices, radio frequency filters, sensors, accelerometers, gyroscopes, motion-sensing devices, fingerprint sensing devices, gesture recognition, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The systems, methods and devices of the disclosure each have several innovative aspects, no single one of which is solely responsible for the desirable attributes disclosed herein. The subject matter described in this disclosure can be implemented in a piezoelectric micromechanical ultrasonic transducer (PMUT), certain aspects of which have been described in U.S. patent application Ser. No. 14/569,280, filed on Dec. 12, 2014 and entitled "MICROMECHANICAL ULTRASONIC TRANSDUCERS AND DISPLAY," and in U.S. patent application Ser. No. 14/569,256, filed on Dec. 12, 2014 and entitled "PIEZOELECTRIC ULTRASONIC TRANSDUCER AND PROCESS", each assigned to the assignee of the present invention and hereby incorporated by reference into the present application in its entirety for all purposes. One innovative aspect of the subject matter described in this disclosure can be implemented by a PMUT array and associated electronics capable of performing, nearly simultaneously, both imaging of surface topography of a finger and imaging of subdermal tissue of the finger. Finger surface topography may consist of ridges, valleys and minutia that are typically used by fingerprint matching algorithms. Imaging of the subdermal tissue may provide additional three-dimensional (3-D) fingerprint information and may be used to provide additional security for authentication/verification. Further, 3-D fingerprint images may serve as a metric for finger liveness determination. Liveness determination is important to verify that an imaged fingerprint is from a living human digit and not a synthetic, dismembered or cadaver human digit. The presently disclosed techniques enable a PMUT array to selectively switch between a first mode that provides high-resolution epidermal imaging, and a second mode that provides lower resolution and higher acoustic pressure appropriate for 3-D subdermal imaging and liveness determination of an object (purportedly a human finger of a live person) being imaged. In the second mode (the "beamforming mode") of operation, transmission side beam-forming may produce a relatively high acoustic pressure, focused beam pattern operable to produce acoustic echoes from subsurface layers of an object being imaged. The characteristic acoustic echoes from subcutaneous tissue (e.g., dermis or hypodermis) of a living human digit being difficult or impossible to spoof, the disclosed techniques enable a high confidence determination of whether or not subsurface features of the object being imaged is consistent with living subcutaneous tissue. Thus, a single apparatus may perform both fingerprint surface imaging and fingerprint 3-D imaging for additional security and liveness determination. Because the same PMUT array may be used for both fingerprint surface imaging and 3-D imaging including liveness determination, and each function may be performed within a few seconds or portion of a second, anti-spoofing protection may be provided for an existing ultrasonic fingerprint imaging system with little additional cost or user inconvenience.

One innovative aspect of the subject matter described in this disclosure may be implemented in an apparatus that includes a one- or two-dimensional array of piezoelectric micromechanical ultrasonic transducer (PMUT) elements positioned below, beside, with, on or above a backplane of a display or an ultrasonic fingerprint sensor array.

In some implementations, the PMUT array may be configurable to operate in modes corresponding to multiple frequency ranges. In some implementations, for example, the PMUT array may be configurable to operate in a low-frequency mode corresponding to a low-frequency range (e.g., 50 kHz to 200 kHz) or in a high-frequency mode corresponding to a high-frequency range (e.g., 1 MHz to 25 MHz). When operating in the high-frequency mode, an apparatus may be capable of imaging at relatively higher resolution. Accordingly, the apparatus may be capable of detecting touch, fingerprint, stylus, and biometric information from an object such as a finger placed on the surface of the display or sensor array. Such a high-frequency mode may be referred to herein as a fingerprint sensor mode.

When operating in the low-frequency mode, the apparatus may be capable of emitting sound waves that are capable of relatively greater penetration into air than when the apparatus is operating in the high-frequency mode. Such lower-frequency sound waves may be transmitted through various overlying layers including a cover glass, a touchscreen, a display array, a backlight, a housing or enclosure, or other layers positioned between an ultrasonic transmitter and a display or sensor surface. In some implementations, a port may be opened through one or more of the overlying layers to optimize acoustic coupling from the PMUT array into air. The lower-frequency sound waves may be transmitted through the air above the display or sensor surface, reflected from one or more objects near the surface, transmitted through the air and back through the overlying layers, and detected by an ultrasonic receiver. Accordingly, when operating in the low-frequency mode, the apparatus may be capable of operating in a gesture detection mode, wherein free-space gestures near but not necessarily touching the display may be detected.

Alternatively, or additionally, in some implementations, the PMUT array may be configurable to operate in a medium-frequency mode corresponding to a frequency range between the low-frequency range and the high-frequency range (e.g., about 200 kHz to about 1 MHz). When operating in the medium-frequency mode, the apparatus may be capable of providing touch sensor functionality, although with somewhat less resolution than the high-frequency mode.

The PMUT array may be addressable for wavefront beam forming, beam steering, receive-side beam forming, and/or selective readout of returned signals. For example, individual columns, rows, sensor pixels and/or groups of sensor pixels may be separately addressable. A control system may control an array of transmitters to produce wavefronts of a particular shape, such as planar, circular or cylindrical wavefronts. The control system may control the magnitude and/or phase of the array of transmitters to produce constructive or destructive interference in desired locations. For example, the control system may control the magnitude and/or phase of the array of transmitters to produce constructive interference in one or more locations in which a touch or gesture has been detected or is likely to be detected.

In some implementations, PMUT devices may be co-fabricated with thin-film transistor (TFT) circuitry or CMOS circuitry on the same substrate, which may be a silicon, glass or plastic substrate in some examples. The TFT substrate may include row and column addressing electronics, multiplexers, local amplification stages and control circuitry. In some implementations, an interface circuit including a driver stage and a sense stage may be used to excite a PMUT device and detect responses from the same device. In other implementations, a first PMUT device may serve as an acoustic or ultrasonic transmitter and a second PMUT device may serve as an acoustic or ultrasonic receiver. In some configurations, different PMUT devices may be capable of low- and high-frequency operation (e.g. for gestures and for fingerprint detection). In other configurations, the same PMUT device may be used for low- and high-frequency operation. In some implementations, the PMUT may be fabricated using a silicon wafer with active silicon circuits fabricated in the silicon wafer. The active silicon circuits may include electronics for the functioning of the PMUT or PMUT array.

Figure 1B:
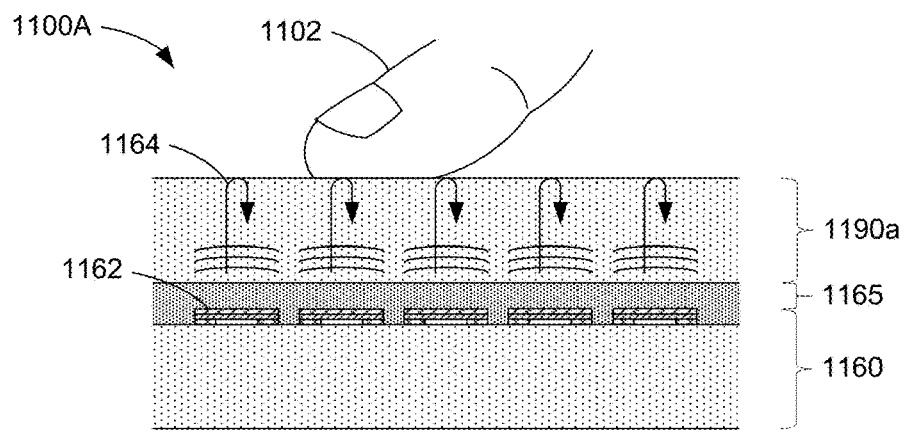
FIGS. 1B-1D illustrate cross-sectional views of various configurations of PMUT ultrasonic sensor arrays.
Figure 1C:
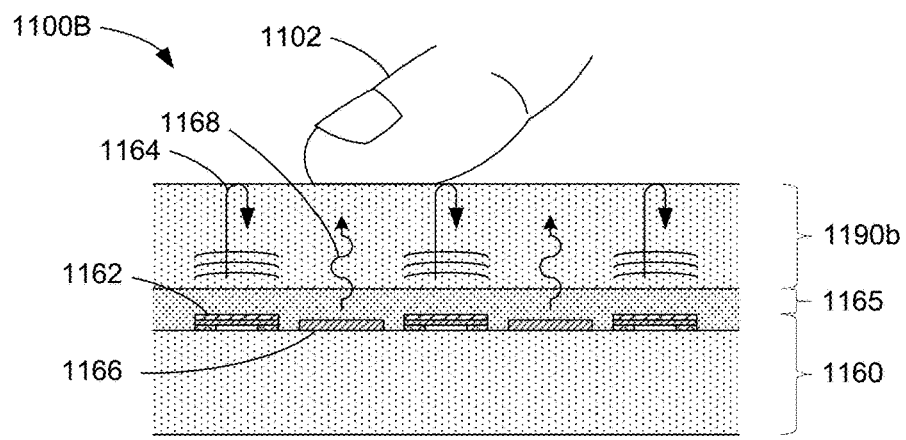
Figure 1D:
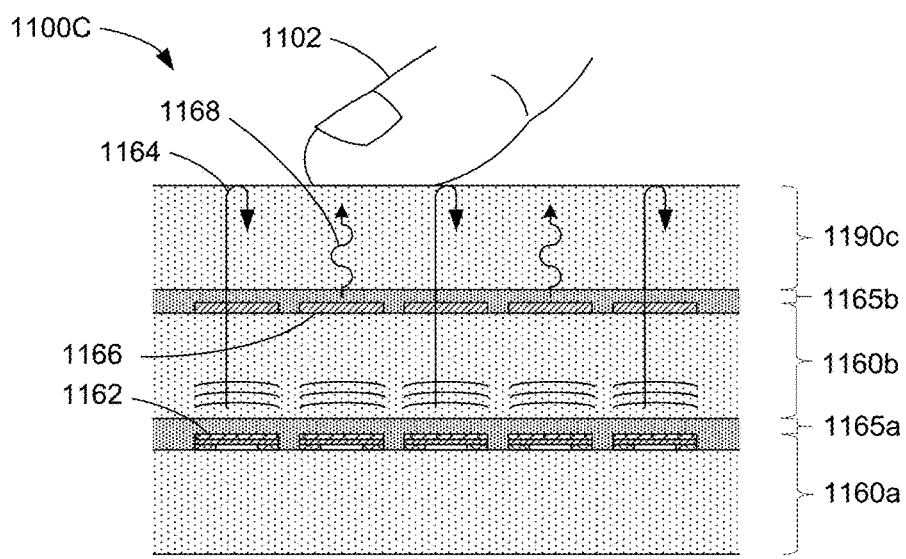

In some implementations the PMUT array may be configured as an ultrasonic sensor array. FIGS. 1B-1D illustrate cross-sectional views of various configurations of PMUT ultrasonic sensor arrays. FIG. 1B depicts an ultrasonic sensor array 1100A with PMUTs as transmitting and receiving elements that may be used, for example, as an ultrasonic fingerprint sensor, an ultrasonic touchpad, or an ultrasonic imager. PMUT sensor elements 1162 on a PMUT sensor array substrate 1160 may emit and detect ultrasonic waves. As illustrated, an ultrasonic wave 1164 may be transmitted from at least one PMUT sensor element 1162. The ultrasonic wave 1164 may travel through an acoustic coupling medium 1165 and a platen 1190a towards an object 1102 such as a finger or a stylus positioned on an outer surface of the platen 1190a. A portion of the ultrasonic wave 1164 may be transmitted through the platen 1190a and into the object 1102, while a second portion is reflected from the surface of platen 1190a back towards the sensor element 1162. The amplitude of the reflected wave may depend in part on the acoustic properties of the object 1102. The reflected wave may be detected by the sensor elements 1162, from which an image of the object 1102 may be acquired. For example, with sensor arrays having a pitch of about 50 microns (about 500 pixels per inch), ridges and valleys of a fingerprint may be detected. An acoustic coupling medium 1165 such as an adhesive, gel, a compliant layer or other acoustic coupling material may be provided to improve coupling between an array of PMUT sensor elements 1162 disposed on the sensor array substrate 1160 and the platen 1190a. The acoustic coupling medium 1165 may aid in the transmission of ultrasonic waves to and from the sensor elements 1162. The platen 1190a may include, for example, a layer of glass, plastic, sapphire, metal, metal alloy, or other platen material. An acoustic impedance matching layer or coating (not shown) may be disposed on an outer surface of the platen 1190a. The platen 1190a may include a coating (not shown) on the outer surface.

FIG. 1C depicts an ultrasonic sensor and display array 1100B with PMUT sensor elements 1162 and display pixels 1166 co-fabricated on a sensor and display substrate 1160. The sensor elements 1162 and display pixels 1166 may be collocated in each cell of an array of cells. In some implementations, the sensor element 1162 and the display pixel 1166 may be fabricated side-by-side within the same cell. In some implementations, part or all of the sensor element 1162 may be fabricated above or below the display pixel 1166. Platen 1190b may be positioned over the sensor elements 1162 and the display pixels 1166 and may function as or include a cover lens or cover glass. The cover glass may include one or more layers of materials such as glass, plastic or sapphire, and may include provisions for a capacitive touchscreen. An acoustic impedance matching layer or coating (not shown) may be disposed on an outer surface of the platen 1190b. Ultrasonic waves 1164 may be transmitted and received from one or more sensor elements 1162 to provide imaging capability for an object 1102 such as a stylus or a finger placed on the cover glass 1190b. The cover glass 1190b is substantially transparent to allow optical light from the array of display pixels 1166 to be viewed by a user through the cover glass 1190b. The user may choose to touch a portion of the cover glass 1190b, and that touch may be detected by the ultrasonic sensor array. Biometric information such as fingerprint information may be acquired, for example, when a user touches the surface of the cover glass 1190b. An acoustic coupling medium 1165 such as an adhesive, gel, or other acoustic coupling material may be provided to improve acoustic, optical and mechanical coupling between the sensor array substrate 1160 and the cover glass. In some implementations, the coupling medium 1165 may be a liquid crystal material that may serve as part of a liquid crystal display (LCD). In LCD implementations, a backlight (not shown) may be optically coupled to the sensor and display substrate 1160. In some implementations, the display pixels 1166 may be part of an amorphous light-emitting diode (AMOLED) display with light-emitting display pixels. In some implementations, the ultrasonic sensor and display array 1100B may be used for display purposes and for touch, stylus or fingerprint detection.

FIG. 1D depicts an ultrasonic sensor and display array 1100C with a sensor array substrate 1160a positioned behind a display array substrate 1160b. An acoustic coupling medium 1165a may be used to acoustically couple the sensor array substrate 1160a to the display array substrate 1160b. An optical and acoustic coupling medium 1165b may be used to optically and acoustically couple the sensor array substrate 1160a and the display array substrate 1160b to a cover lens or cover glass 1190c, which may also serve as a platen for the detection of fingerprints. An acoustic impedance matching layer or coating (not shown) may be disposed on an outer surface of the platen 1190c. Ultrasonic waves 1164 transmitted from one or more sensor elements 1162 may travel through the display array substrate 1160b and cover glass 1190c, reflect from an outer surface of the cover glass 1190c, and travel back towards the sensor array substrate 1160a where the reflected ultrasonic waves may be detected and image information acquired. In some implementations, the ultrasonic sensor and display array 1100C may be used for providing visual information to a user and for touch, stylus or fingerprint detection from the user. Alternatively, a PMUT sensor array may be formed on the backside of the display array substrate 1160b. Alternatively, the sensor array substrate 1160a with a PMUT sensor array may be attached to the backside of the display array substrate 1160b, with the backside of the sensor array substrate 1160a attached directly to the backside of the display array substrate 1160b, for example, with an adhesive layer or adhesive material (not shown).

Techniques for spoofing a human fingerprint have advanced to the point that at least the perceived reliability and security of this form of biometric authentication has been called into question. Spoofing may include use of synthetic objects having a surface that mimics a human fingerprint's ridge and valley characteristics. Spoofing may also involve the use of real human digits, dismembered from a living or dead human victim.

Figure 2:
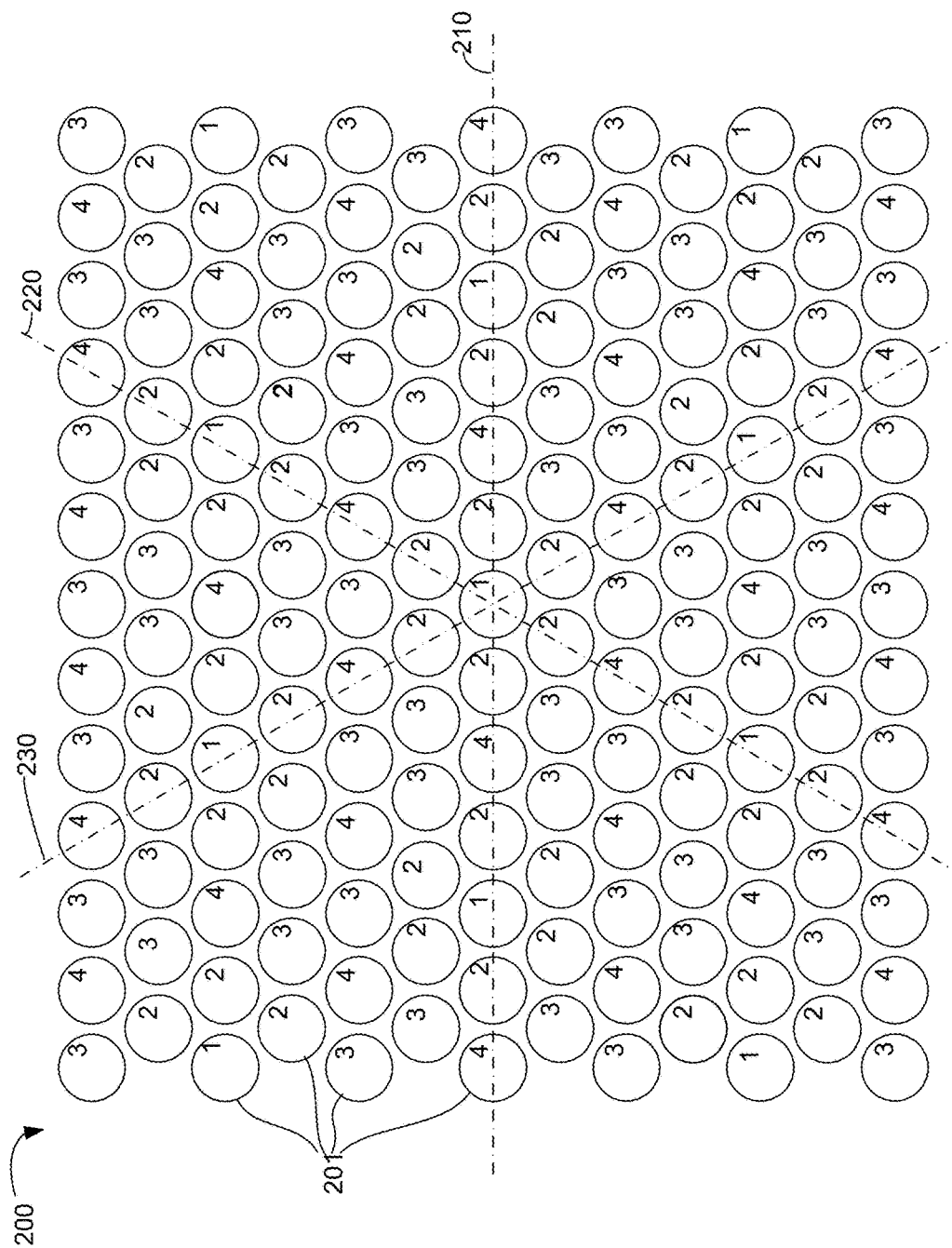
FIG. 2 illustrates a PMUT array according to an implementation.

The presently disclosed techniques contemplate a PMUT array that is operable both for fingerprint imaging and spoofing prevention. FIG. 2 illustrates a PMUT array according to an implementation. In the illustrated example, the PMUT array 200 includes 163 PMUT elements or PMUTs 201. Each PMUT element 201 may correspond to or be referred to as a "pixel". In the illustrated example, the PMUT array 200 includes an arrangement of alternating rows of pixels that are "staggered" such that PMUT elements in alternate rows are shifted by half a pitch distance between adjacent pixels within a row. Such an arrangement may also be referred to as a "hexagonal lattice" by which is meant a honeycomb-like arrangement of pixels configured such that any pixel, other than an edge pixel, is adjacent to six neighboring pixels, rows of adjacent pixels being disposed along or parallel to one of three principle axes, each of the three principle axes being disposed at an approximately equal angular separation with respect to the other two axes. In the illustrated example, first axis 210 is disposed horizontally, whereas second axis 220 and third axis 230 are disposed respectively at +60 degrees and −60 degrees inclination with respect to the horizontal axis.

Figure 3:
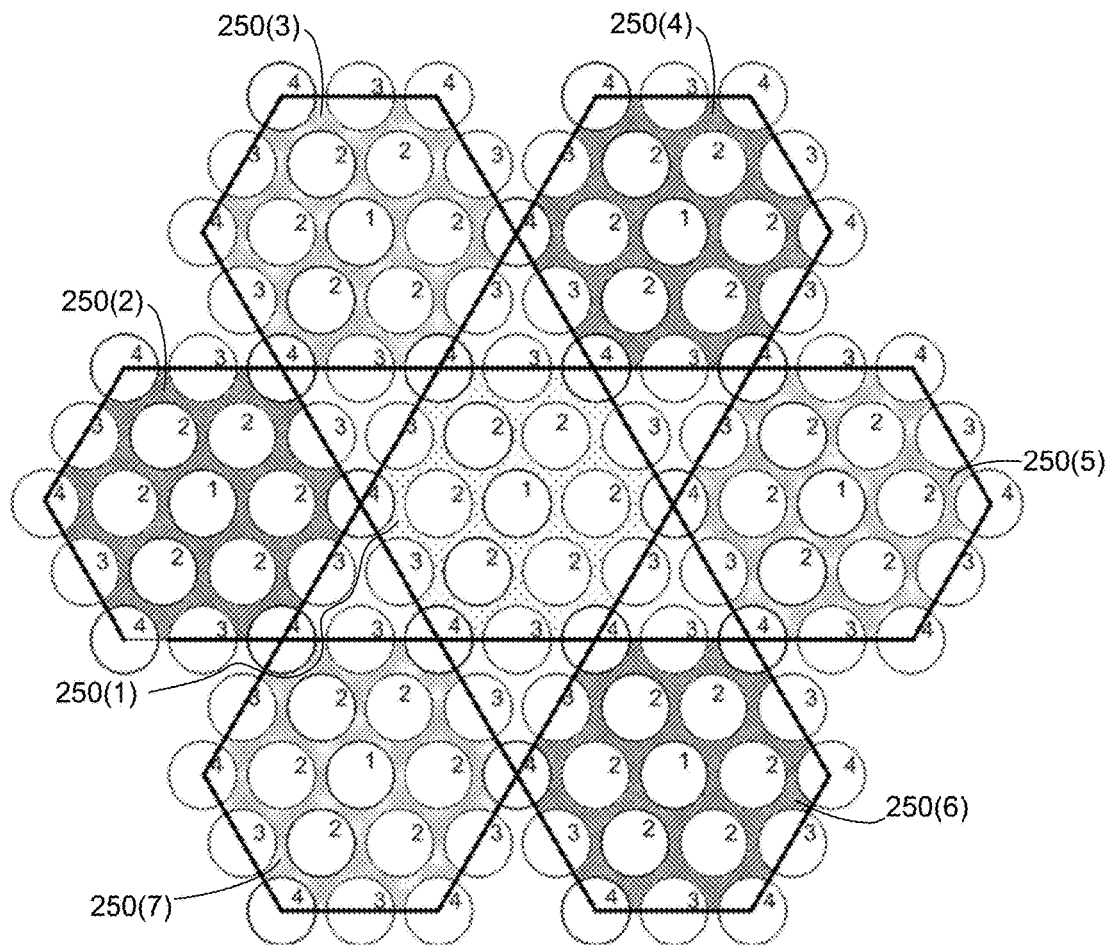
FIG. 3 shows a portion of a PMUT array according to some implementations.

Referring still to FIG. 2, it may be observed that each pixel 201 in PMUT array 200 has been annotated with an integer number: 1, 2, 3 or 4. The meaning of the annotation may be better appreciated by referring to FIG. 3, which shows a portion of PMUT array 200, according to some implementations. More particularly, the illustrated portion of PMUT array 200 that includes 121 pixels 201 that are disposed so as to form seven "superpixel" regions 250. A "superpixel", as the term is used herein and in the claims, means a plurality of pixels, including at least one inner pixel disposed in a central portion of a superpixel region, and one or more sets (e.g. rings) of outer pixels disposed in an outer portion of the superpixel region. As illustrated in FIG. 3, a superpixel may include a single center pixel and one or more rings of pixels that surround the center pixel, each pixel in a ring of pixels having a substantially equal distance from the center pixel.

More particularly, in the implementation illustrated in FIG. 3, each of seven hexagonal superpixel regions 250(*i*) includes a respective inner pixel (annotated by the integer '1') located proximate to a center of the superpixel region. An inner pixel 1 may also be referred to as a "center pixel". In the illustrated implementation, a single center pixel is disposed proximate to the center of each superpixel region. More generally however, a first group or set of ("first pixel set") of inner pixels may be contemplated that are disposed proximate to and equidistant from the center of each superpixel region.

Each superpixel region 250 also includes outer pixels disposed in an outer portion of the superpixel region 250. In the illustrated example, each superpixel region 250 includes a second set or group of outer pixels ("second pixel set"), annotated by the integer '2'. Six outer pixels 2 are shown to be proximate to and substantially equidistant from each respective center pixel 1. In the illustrated example, each superpixel region 250 also includes a third pixel set that includes pixels that are disposed on a boundary of each superpixel region. Pixels in the third pixel set, annotated by the integer '3', are disposed proximate to a center of each edge of the hexagonal superpixel region 250 and are substantially equidistant from the center pixel 1. A fourth pixel set includes pixels annotated by the integer '4' that are disposed proximate to each corner of the hexagonal superpixel region 250, and are substantially equidistant from the center pixel 1.

It will be appreciated that outer pixels 3 are more distant from the center pixel 1 than outer pixels 2, and less distant from the center pixel 1 than outer pixels 4. Thus, PMUT elements in a superpixel may be grouped according to their position from the center of the superpixel. In some implementations, one or more sets or groups of outer pixels may be shared between adjacent superpixels. In the example implementation illustrated in FIG. 3, pixels of the fourth pixel set may be shared between adjacent superpixels.

As will be explained in more detail hereinbelow, each PMUT element in each pixel set may be systematically coupled with transceiver electronics, such that the pixel sets may be separately actuated with a transmission signal having a controllable phase and/or time delay. When plane wave excitation and transmission is desired, appropriate for fingerprint imaging, for example, this may be achieved by applying substantially the same delay to all groups of PMUT elements in the superpixel. Alternatively, in a beam-focusing or transmit-side beamforming mode, the time delay for each respective pixel set may be selected so that the acoustic pressure created by each superpixel is focused at a predetermined distance from the center pixel(s) using beamforming principles.

Figure 4:
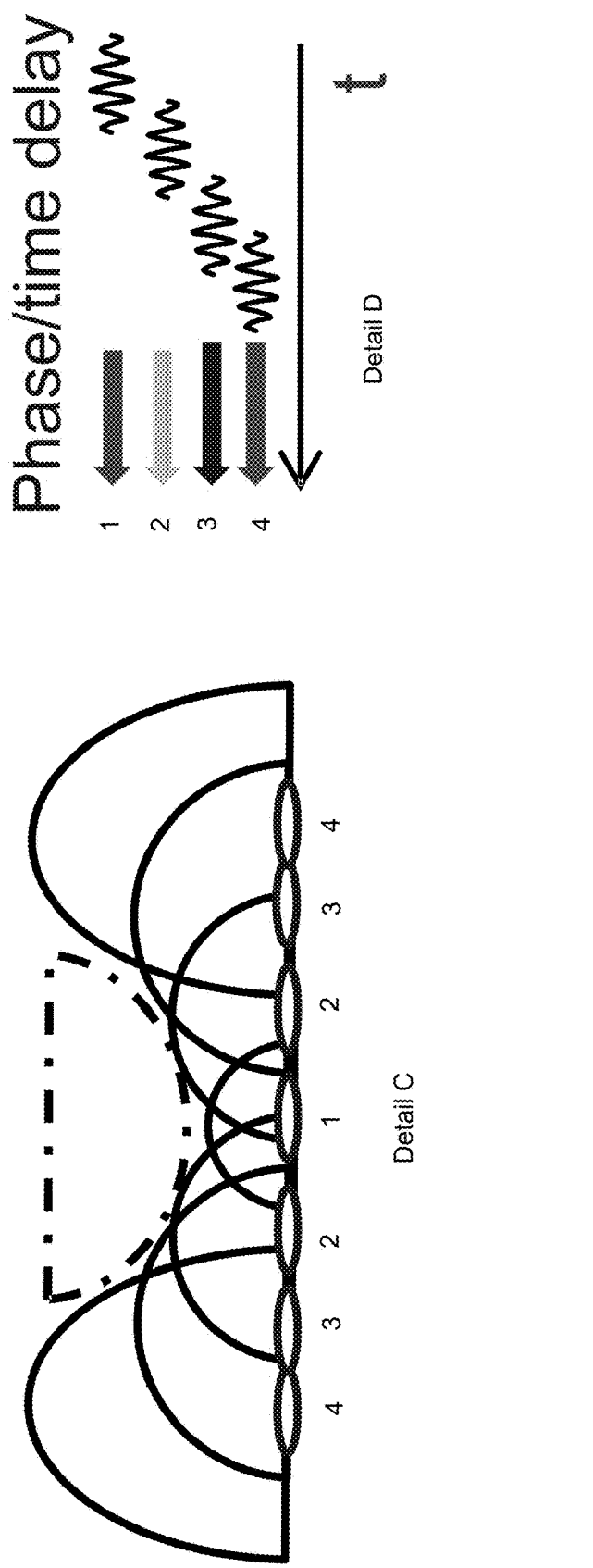
FIG. 4 illustrates an example of beam forming for a superpixel region.

FIG. 4 illustrates an example of beam-focusing or transmitter side beamforming for a superpixel region including pixel sets as described above. By appropriately applying phase/time delays to each respective pixel set, time of flight and constructive interference between ultrasonic emissions from each group of PMUT elements within the superpixel may result in a focused, highly shaped, and relatively high intensity ultrasonic signal. For example, each pixel set may be supplied with a transmission signal having a predetermined time delay. The time delay for each pixel set may be selected so that the acoustic pressure created by each superpixel is focused at a predetermined location. As illustrated in FIG. 4, the ultrasonic emissions from a superpixel may be focused by first applying an excitation signal to the fourth pixel set; following a time delay, applying the excitation signal to the third pixel set; following another time delay, applying the excitation signal to the second pixel set; and, following yet a further time delay, applying excitation signal to the center pixel (or first pixel set) as shown in Detail D. As a result a focused beam of relatively high acoustic pressure may be generated proximate to the center of the superpixel region as shown in Detail C.

Figure 5:
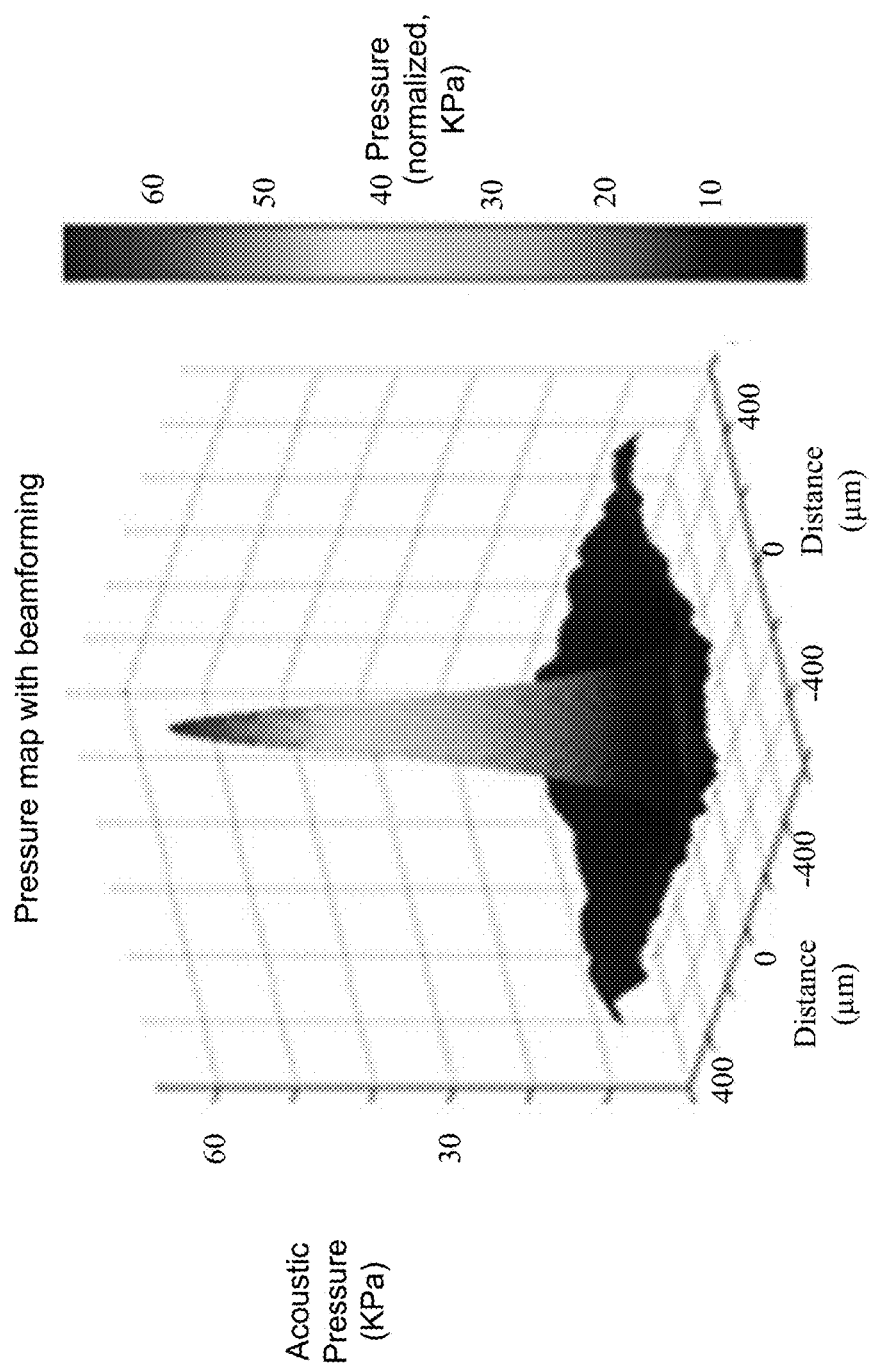
FIG. 5 illustrates an example acoustic pressure map for a superpixel of PMUT elements operated in a beamforming mode.

FIG. 5 illustrates an example acoustic pressure map for a superpixel of PMUT elements operated in a beamforming mode. It may be observed that the superpixel may generate a well-focused beam having relatively high acoustic pressure at a distance of interest along the thickness direction of the object being imaged. The focused beam may have an acoustic pressure that is substantially higher (at least 2× higher) than the average acoustic pressure produced when operating in a plane wave excitation transmission mode. In the illustrated example, the peak acoustic pressure is approximately six times greater than the average acoustic pressure produced when operating in a plane wave excitation and transmission mode (e.g., comparing FIG. 5 with FIG. 1A, Detail B). The distance of interest (which may correspond to a selected depth of focus) is determined by the spacing between pixel sets 250(1) through 250(4) and configurable time delays. By controlling the time delays between pixel sets 250(1) through 250(4) of the superpixel region 250, different depths of the finger tissue may be imaged to provide 3-D tissue imaging as well as liveness determination.

Each of the example superpixels 250(i) illustrated in FIG. 3 may be characterized as including 19 pixels arranged along a hexagonal lattice. It should be noted that any number of alternative superpixel arrangements are contemplated by the present disclosure, provided only that the superpixel includes, as defined above, a plurality of pixels, including at least one inner pixel disposed in a central portion of a superpixel region, and one or more sets of outer pixels disposed in an outer portion of the superpixel region.

Figure 6:
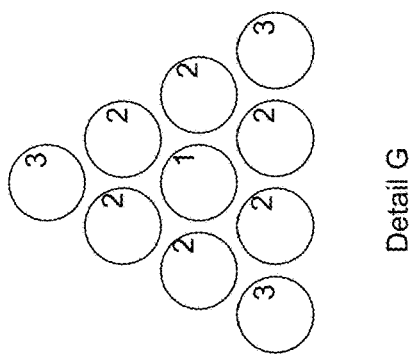
FIG. 6 illustrates some examples of superpixel arrangements as contemplated by the present disclosure.
Figure 6:
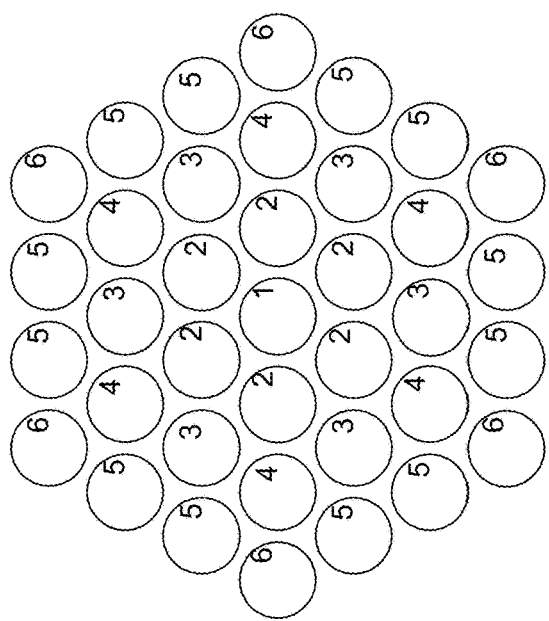
Figure 6:
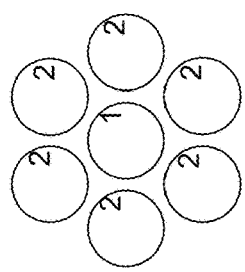

FIG. 6 illustrates some examples of superpixel arrangements as contemplated by the present disclosure. Detail E of FIG. 6 illustrates a superpixel including seven pixels arranged on a hexagonal lattice so as to form a hexagon that includes one center pixel (1) and a first pixel set of six pixels (2) disposed in an outer portion of the superpixel region approximately equidistant from pixel (1).

Detail F illustrates a superpixel including 37 pixels arranged on a hexagonal lattice so as to form a hexagon that includes one center pixel (first pixel set) (1) and five additional pixel sets, each disposed in an outer portion of the superpixel region at various distances from the center pixel (1). It will be appreciated that each pixel in a third pixel set of pixels (3) is disposed at a greater distance from the center pixel (1) than each of the pixels (2) included in a second pixel set and at a lesser distance from the center pixel (1) than each pixel in a fourth pixel set that includes pixels (4). Similarly, each of the pixels (5) is disposed at a greater distance from the center pixel (1) than each of the pixels (4) and at a lesser distance from the center pixel (1) than each of the pixels (6).

Detail G illustrates a superpixel including ten pixels arranged on a hexagonal lattice so as to form a triangle that includes one center pixel (first pixel set) (1) and two additional pixel sets disposed, in an outer portion of the superpixel region, at various distances from the center pixel (1). Each of a second pixel set that includes six pixels (2) is disposed proximate to the center pixel (1). Each of a third pixel set that includes three pixels (3) is disposed at a greater distance from the center pixel (1) than each of the pixels (2).

Figure 7:
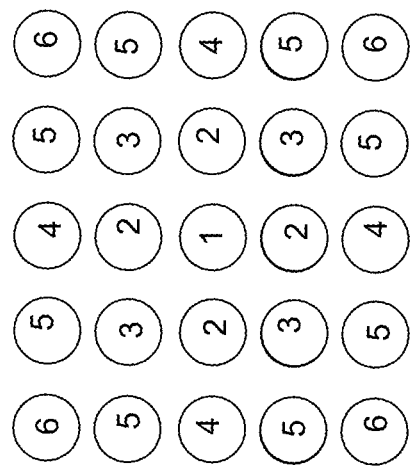
FIG. 7 illustrates further examples of superpixel arrangements as contemplated by the present disclosure.
Figure 7:
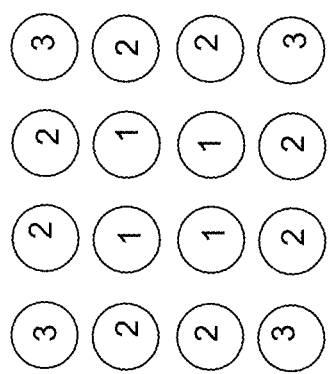
Figure 7:
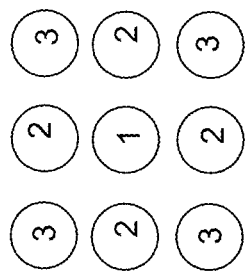

FIG. 7 illustrates further examples of superpixel arrangements as contemplated by the present disclosure. In the illustrated examples, pixels are aligned along orthogonal rows and columns rather than the hexagonal lattice arrangements contemplated in previous examples. Detail J of FIG. 7 illustrates a superpixel including nine pixels arranged to form a square that includes one center pixel (first pixel set) (1) and two additional pixel sets including pixels disposed, in an outer portion of the superpixel region, at various distances from the center pixel (1). Each of a second pixel set of four pixels (2) is disposed proximate to the center pixel (1). Each of a third pixel set of four pixels (3) is disposed at a greater distance from the center pixel (1) than each of the pixels (2).

Detail K of FIG. 7 illustrates a superpixel including sixteen pixels arranged to form a square that includes a first pixel set of four pixels (1) disposed in a central portion of the superpixel and two additional groups of pixels disposed, in an outer portion of the superpixel, at various distances from the central portion. Each of a second pixel set of eight pixels (2) is disposed proximate to the first pixel set of pixels (1). Each of a third pixel set of four pixels (3) is disposed at a greater distance from the first pixel set of pixels (1) than each of the second pixel set of pixels (2). In this arrangement, the distances from the center of each pixel (2) to the centroid of the first pixel set are substantially the same. Similarly, the distances from the center of each pixel (3) to the centroid of the first pixel set are substantially the same.

Detail L of FIG. 7 illustrates a superpixel including 25 pixels arranged to form a square that includes one center pixel (first pixel set) (1) and five additional pixel sets of pixels disposed in an outer portion of the superpixel at various distances from the center pixel (1). Each of a second pixel set of four pixels (2) is disposed proximate to the center pixel (1). Each of a third pixel set of four pixels (3) is disposed at a greater distance from the center pixel (1) than each of the pixels (2) in the second pixel set. Each of a fourth pixel set of four pixels (4) is disposed at a greater distance from the center pixel (1) than each of the pixels (3) in the third pixel set. Each of a fifth pixel set of eight pixels (5) is disposed at a greater distance from the center pixel (1) than each of the pixels (4) in the fourth pixel set. Each of a sixth pixel set of four pixels (6) is disposed at a greater distance from the center pixel (1) than each of the pixels (5) in the fifth pixel set.

Figure 8:
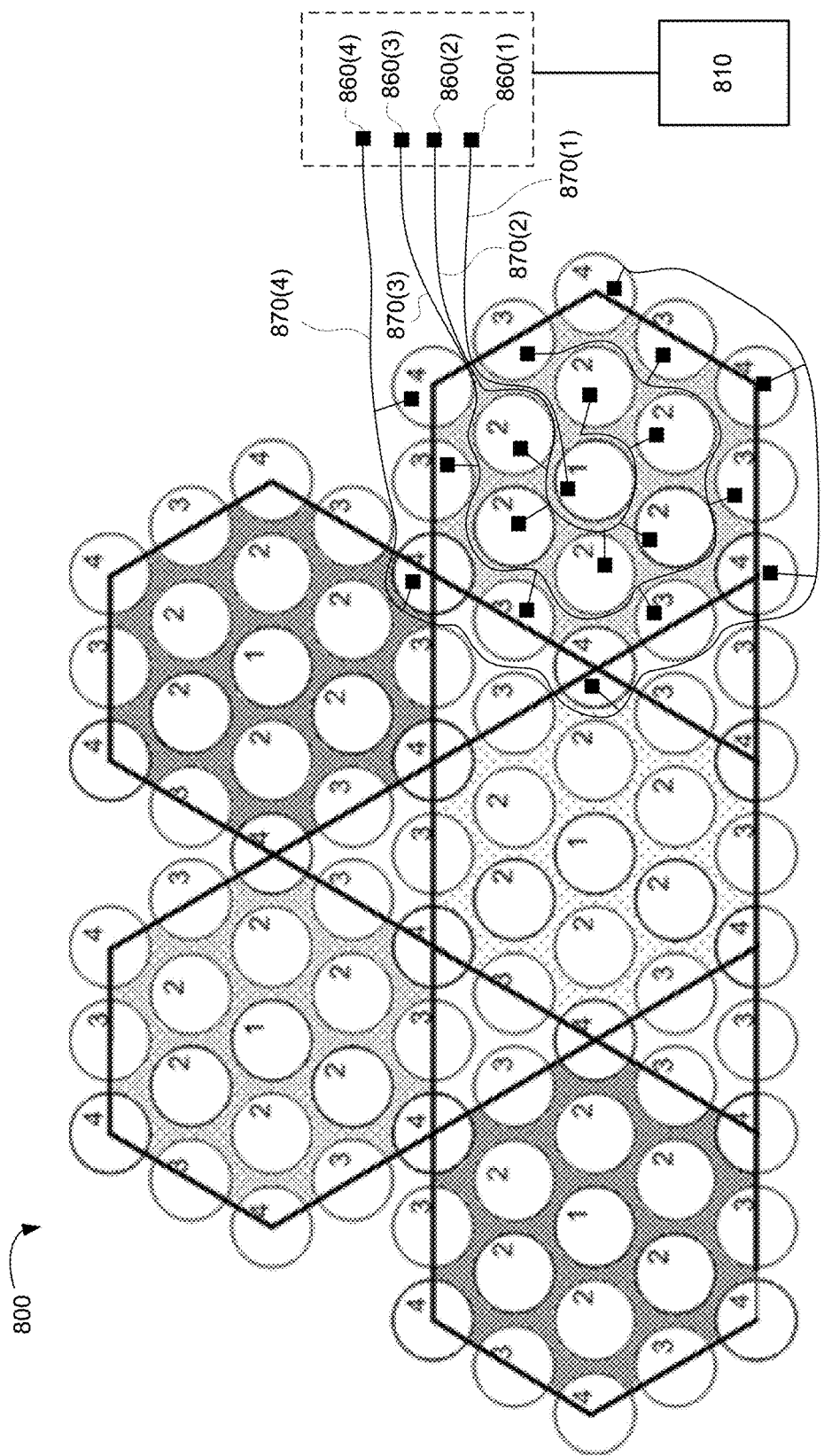
FIG. 8 illustrates an array of superpixels, according to some implementations.

FIG. 8 illustrates an array 800 of superpixels, according to some implementations. As described above in connection with FIG. 3, each superpixel region 250(*i*) includes a center pixel (first pixel set) (1), a second pixel set of pixels (2), a third pixel set of pixels (3), and a fourth pixel set of pixels (4). In the illustrated implementation, the array 800 includes drive input terminals 860(1), 860(2), 860(3), 860(4), which may be communicatively coupled with transceiver electronics 810. Each drive input terminal may be electrically coupled by way of a respective fixedly configured (hard-wired) conductive path with a corresponding pixel set. That is, as illustrated, drive input terminal 860(1) is conductively coupled by way of fixedly configured conductive path 870(1) with center pixel (first pixel set) (1); drive input terminal 860(2) is conductively coupled by way of fixedly configured conductive path 870(2) with the second pixel set of pixels (2); drive input terminal 860(3) is conductively coupled by way of fixedly configured conductive path 870(3) with the third pixel set of pixels (3); and drive input terminal 860(4) is conductively coupled by way of fixedly configured conductive path 870(4) with the fourth pixel set of pixels (4).

For clarity of illustration, pixel sets of only a single superpixel region are shown to be coupled with respective drive input terminals (860). It will be appreciated, however, that two or more superpixel regions may be similarly coupled with the same drive input terminals. Alternatively or in addition, some superpixel regions may be coupled with a different set of drive input terminals.

As noted above, each of the drive input terminals 860 may be communicatively coupled with transceiver electronics. The transceiver electronics may be configured to transmit signals to each of the drive input terminals. In a first mode of operation, the transceiver electronics may concurrently, or nearly simultaneously, transmit signals to each of the drive input terminals. As a result, each pixel in each pixel set may be separately actuated with a transmission signal of substantially the same phase delay to produce a plane wave excitation pattern appropriate for fingerprint imaging, for example. Alternatively, in a second mode of operation the transceiver electronics may sequentially transmit signals to each of the first drive input terminal, the second drive input terminal, and the third drive input terminal, such that a time delay occurs between transmitting signals to each respective pixel set. The time delay for each respective pixel set may be selected so that the acoustic pressure created by each superpixel is focused at a predetermined distance from the center pixel(s) using beamforming principles.

Figure 9:
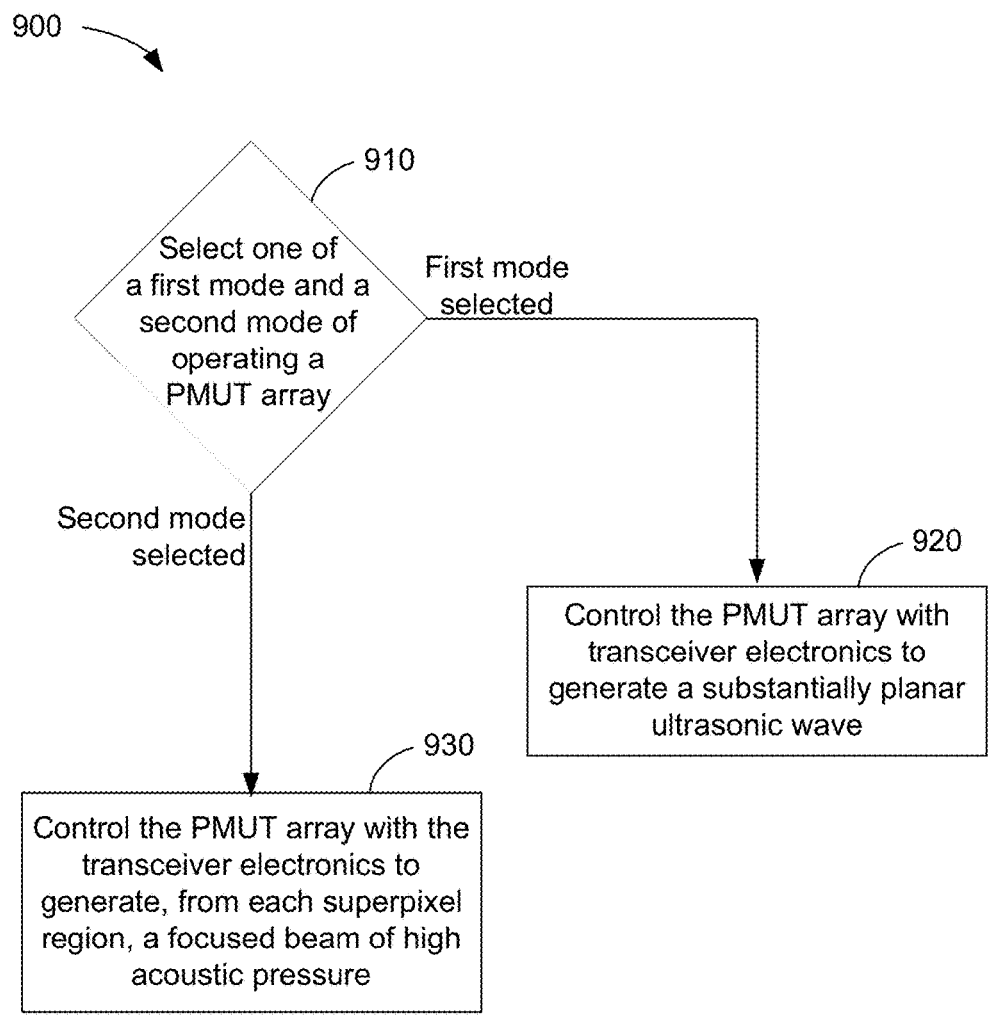
FIG. 9 illustrates an example of a process flow for operating a PMUT array in a selectable one of a first mode and a second mode.

FIG. 9 illustrates an example of a process flow for operating a PMUT array in a selectable one of a first mode and a second mode. As described hereinabove, the PMUT array may include a plurality of superpixel regions, each superpixel region including at least two pixel sets, a first pixel set of the at least two pixel sets being disposed in a central portion of the superpixel region and at least a second pixel set being disposed in an outer portion of the superpixel region, the array having an electrical coupling with transceiver electronics. In the illustrated implementation, method 900 includes a step 910 for selecting one of a first mode and a second mode of operating the PMUT array.

In some implementations, the transceiver electronics may be configured to switch rapidly from a transmit mode that allows launching of either plane ultrasonic waves or focused ultrasonic waves to a receive mode that allows the detection of ultrasonic signals reflected from an object, which may be useful for applications such as subdermal imaging where the acoustic path length from the object to the PMUT array is longer than a couple of acoustic wavelengths. In configurations where the distance from the PMUT array to the object to be imaged (e.g., a finger positioned on the surface of a platen) is less than a couple of acoustic wavelengths, it may be desirable to include a separate set of dedicated receive electrodes on each pixel in the superpixel array to allow simultaneous or at least overlapping transmitting and receiving of ultrasonic signals with each pixel or each set of pixels in the superpixel region (also known as three-port pixels or three-port PMUTs).

When the selection at step 910 is to operate in the first mode, the method may proceed, at step 920, to control a PMUT array with the transceiver electronics to generate a substantially plane ultrasonic wave. The electrical coupling between the transceiver electronics and the PMUT array may include a first fixedly configured conductive path connecting pixels in the first pixel set with a first drive input terminal and a second fixedly configured conductive path connecting pixels and the second pixel set with a second drive input terminal. More particularly, in the first operating mode the transceiver electronics may concurrently transmit signals to each of the first drive input terminal and the second drive input terminal. The signals, being received at the input terminals substantially simultaneously, may cause the array to generate a substantially plane ultrasonic wave.

When the selection at step 910 is to operate in the second mode, the method may proceed, at step 930, to control a PMUT array with the transceiver electronics to generate from each superpixel region a focused beam of relatively higher acoustic pressure. More particularly, in the second operating mode, the transceiver electronics may sequentially transmit signals to each of the first drive input terminal and the second drive input terminal such that a time delay occurs between delivery of a first transmission signal to the second drive input terminal and delivery of a second transmission signal to the first drive input terminal. The time delay may be selected, using beamforming principles, so that the acoustic pressure created by each superpixel is focused at a predetermined distance from the center pixel(s).

Thus, an arrangement, including an array of piezoelectric ultrasonic transducers configured as superpixels, operable to selectively perform either fingerprint imaging (e.g. epidermal imaging) or subdermal imaging (e.g. for liveness detection), has been disclosed. It will be appreciated that a number of alternative configurations and fabrication techniques may be contemplated.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by or to control the operation of data processing apparatus.

If implemented in software, the functions may be stored on or transmitted over as one or more instructions or code on a computer-readable medium, such as a non-transitory medium. The processes of a method or algorithm disclosed herein may be implemented in a processor-executable software module which may reside on a computer-readable medium. Computer-readable media include both computer storage media and communication media including any medium that can be enabled to transfer a computer program from one place to another. Storage media may be any available media that may be accessed by a computer. By way of example, and not limitation, non-transitory media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, as a person having ordinary skill in the art will readily appreciate, the terms "upper" and "lower", "top" and "bottom", "front" and "back", and "over", "overlying", "on", "under" and "underlying" are sometimes used for ease of describing the figures and indicate relative positions corresponding to the orientation of the figure on a properly oriented page, and may not reflect the proper orientation of the device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
an array of piezoelectric ultrasonic transducer elements, the array including a plurality of superpixel regions, each superpixel region including at least two pixel sets, a first pixel set of the at least two pixel sets being disposed in a central portion of the superpixel region, and at least a second pixel set being disposed in an outer portion of the superpixel region;

transceiver electronics; and
an electrical coupling between the transceiver electronics and the array; wherein
the transceiver electronics is configured to operate the array in a selectable one of a first mode and a second mode;
in the first mode, the array generates a substantially plane ultrasonic wave having a first acoustic pressure;
in the second mode, the array generates, from each superpixel region, a focused beam having a second acoustic pressure that is substantially higher than the first acoustic pressure;
the superpixel region includes seven pixels arranged on a hexagonal lattice so as to form a hexagon;
the first pixel set includes one center pixel disposed proximate to a center of the hexagon;
the second pixel set includes six pixels, each disposed in the outer portion of the superpixel region approximately equidistant from the center pixel;
the transceiver electronics and the array includes a first fixedly configured conductive path connecting pixels in the first pixel set with a first drive input terminal and a second fixedly configured conductive path connecting pixels in the second pixel set with a second drive input terminal, the first drive input terminal and the second drive input terminal being coupled with the transceiver electronics; and
the first pixel set is actuated separately from the second pixel set with a transmission signal having a controllable phase and/or time delay.

2. The apparatus of claim 1, wherein:
in the first mode, the transceiver electronics concurrently transmits signals to each of the first drive input terminal and the second drive input terminal; and
in the second mode, the transceiver electronics sequentially transmits signals to each of the first drive input terminal and the second drive input terminal such that a time delay occurs between delivery of a first transmission signal to the second drive input terminal and delivery of a second transmission signal to the first drive input terminal.

3. The apparatus of claim 1, further including a third pixel set and a fourth pixel set, wherein:
the superpixel region includes nineteen pixels arranged on a hexagonal lattice so as to form a hexagon;
the first pixel set includes one center pixel disposed proximate to a center of the hexagon;
the second pixel set includes six pixels disposed in an outer portion of the superpixel region approximately equidistant from the center pixel; and
the third pixel set includes six pixels, each disposed at a greater distance from the center pixel than each pixel in the second pixel set and at a lesser distance from the center pixel than each pixel in the fourth pixel set.

4. The apparatus of claim 3, wherein the electrical coupling between the transceiver electronics and the array includes:
a first fixedly configured conductive path connecting pixels in the first pixel set with a first drive input terminal;
a second fixedly configured conductive path connecting pixels in the second pixel set with a second drive input terminal;
a third fixedly configured conductive path connecting pixels in the third pixel set with a third drive input terminal;
a fourth fixedly configured conductive path connecting pixels in the fourth pixel set with a fourth drive input terminal; and
each of the first drive input terminal, the second drive input, the third drive input, and the fourth drive input is coupled with the transceiver electronics.

5. The apparatus of claim 4, wherein:
in the first mode, the transceiver electronics concurrently transmits signals to each of the first drive input terminal, the second drive input terminal, the third drive input terminal, and the fourth drive input terminal; and
in the second mode, the transceiver electronics sequentially transmits signals to each of the first drive input terminal, the second drive input terminal, the third drive input terminal, and the fourth drive input terminal, such that:
a first time delay occurs between delivery of a first transmission signal to the fourth drive input terminal and delivery of a second transmission signal to the third drive input terminal;
a second time delay occurs between delivery of the second transmission signal to the third drive input terminal and delivery of a third transmission signal to the second drive input terminal; and
a third time delay occurs between delivery of the third transmission signal to the third drive input terminal and delivery of a fourth transmission signal to the first drive input terminal.

6. The apparatus of claim 1, further including a third pixel set, wherein:
the superpixel region includes nine pixels arranged along orthogonal rows and columns so as to form a square;
the first pixel set includes one center pixel;
the second pixel set includes four pixels, each disposed in the outer portion of the superpixel region approximately equidistant from the center pixel; and
the third pixel set includes four pixels, each disposed in the outer portion of the superpixel region approximately equidistant from the center pixel, at a greater distance from the center pixel than each pixel of the second pixel set.

7. The apparatus of claim 6, wherein:
the electrical coupling between the transceiver electronics and the array includes:
a first fixedly configured conductive path connecting pixels in the first pixel set with a first drive input terminal;
a second fixedly configured conductive path connecting pixels in the second pixel set with a second drive input terminal; and
a third fixedly configured conductive path connecting pixels in the third pixel set with a third drive input terminal; wherein:
each of the first drive input terminal, the second drive input, and the third drive input is coupled with the transceiver electronics.

8. The apparatus of claim 7, wherein:
in the first mode, the transceiver electronics concurrently transmits signals to each of the first drive input terminal, the second drive input terminal, and the third drive input terminal; and
in the second mode, the transceiver electronics sequentially transmits signals to each of the first drive input terminal, the second drive input terminal, and the third drive input terminal, such that:

a first time delay occurs between delivery of a first transmission signal to the third drive input terminal and delivery of a second transmission signal to the second drive input terminal; and a second time delay occurs between delivery of the second transmission signal to the second drive input terminal and delivery of a third transmission signal to the first drive input terminal.

9. The apparatus of claim 1, further comprising a platen and an acoustic coupling medium disposed above the array, wherein the array is configured to receive or transmit ultrasonic signals through the platen and the coupling medium.

10. A method comprising:
operating an array of piezoelectric ultrasonic transducer elements in a selectable one of a first mode and a second mode, the array including a plurality of superpixel regions, each superpixel region including at least two pixel sets, a first pixel set of the at least two pixel sets being disposed in a central portion of the superpixel region, and at least a second pixel set being disposed in an outer portion of the superpixel region, the array having an electrical coupling with transceiver electronics; wherein
  in the first mode, operating the array generates a substantially plane ultrasonic wave having a first acoustic pressure; and
  in the second mode, operating the array generates, from each superpixel region, a focused beam having a second acoustic pressure that is substantially higher than the first acoustic pressure;
  the superpixel region includes seven pixels arranged on a hexagonal lattice so as to form a hexagon;
  the first pixel set includes one center pixel disposed proximate to a center of the hexagon;
  the second pixel set includes six pixels, each disposed in the outer portion of the superpixel region approximately equidistant from the center pixel;
  the electrical coupling between the transceiver electronics and the array includes a first fixedly configured conductive path connecting pixels in the first pixel set with a first drive input terminal and a second fixedly configured conductive path connecting pixels in the second pixel set with a second drive input terminal, the first drive input terminal and the second drive input terminal being coupled with the transceiver electronics; and
  the first pixel set is actuated separately from the second pixel set with a transmission signal having a controllable phase and/or time delay.

11. The method of claim 10, wherein:
in the first mode, the transceiver electronics concurrently transmits signals to each of the first drive input terminal and the second drive input terminal; and
in the second mode, the transceiver electronics sequentially transmits signals to each of the first drive input terminal and the second drive input terminal such that a time delay occurs between delivery of a first transmission signal to the second drive input terminal and delivery of a second transmission signal to the first drive input terminal.

12. The method of claim 10, wherein:
the superpixel region includes a third pixel set and nine pixels arranged along orthogonal rows and columns so as to form a square;
the first pixel set includes one center pixel;

the second pixel set includes four pixels, each disposed in the outer portion of the superpixel region approximately equidistant from the center pixel; and
the third pixel set includes four pixels, each disposed in the outer portion of the superpixel region approximately equidistant from the center pixel, at a greater distance from the center pixel than each pixel of the second pixel set.

13. An apparatus comprising:
an array of piezoelectric ultrasonic transducer elements in a selectable one of a first mode and a second mode, the array including a plurality of superpixel regions, each superpixel region including at least two pixel sets, a first pixel set of the at least two pixel sets being disposed in a central portion of the superpixel region, and at least a second pixel set being disposed in an outer portion of the superpixel region; and
means for operating the array, wherein:
  operating the array of piezoelectric ultrasonic transducer elements includes:
    in the first mode, controlling the array to generate a substantially plane ultrasonic wave having a first acoustic pressure; and
    in the second mode, controlling the array to generate, from each superpixel region, a focused beam having a second acoustic pressure that is substantially higher than the first acoustic pressure;
  the superpixel region includes seven pixels arranged on a hexagonal lattice so as to form a hexagon;
  the first pixel set includes one center pixel disposed proximate to a center of the hexagon;
  the second pixel set includes six pixels, each disposed in the outer portion of the superpixel region approximately equidistant from the center pixel;
  the means for operating the array has an electrical coupling with a first drive input terminal and a second drive input terminal of the array, the electrical coupling including a first fixedly configured conductive path connecting pixels in the first pixel set with the first drive input terminal and a second fixedly configured conductive path connecting pixels in the second pixel set with the second drive input terminal; and
  the first pixel set is actuated separately from the second pixel set with a transmission signal having a controllable phase and/or time delay.

14. The apparatus of claim 13, wherein:
operating the array of piezoelectric ultrasonic transducer elements includes:
in the first mode, concurrently transmitting signals to each of the first drive input terminal and the second drive input terminal; and
in the second mode, sequentially transmitting signals to each of the first drive input terminal and the second drive input terminal such that a time delay occurs between delivery of a first transmission signal to the second drive input terminal and delivery of a second transmission signal to the first drive input terminal.

15. The apparatus of claim 13, further including a third pixel set and a fourth pixel set, wherein
the superpixel region includes nineteen pixels arranged on a hexagonal lattice so as to form a hexagon;
the first pixel set includes one center pixel disposed proximate to a center of the hexagon;
the second pixel set includes six pixels disposed in an outer portion of the superpixel region approximately equidistant from the center pixel; and the third pixel set includes six pixels, each disposed at a greater distance from the center pixel than each pixel in the second pixel set and at a lesser distance from the center pixel than each pixel in the fourth pixel set.

16. The apparatus of claim 15, wherein the electrical coupling includes a third fixedly configured conductive path connecting pixels in the third pixel set with the third drive input terminal, and a fourth fixedly configured conductive path connecting pixels in the fourth pixel set with the fourth drive input terminal.

17. The apparatus of claim 16, wherein operating the array of piezoelectric ultrasonic transducer elements includes:
   in the first mode, concurrently transmitting signals to each of the first drive input terminal, the second drive input terminal, the third drive input terminal, and the fourth drive input terminal; and
   in the second mode, sequentially transmitting signals to each of the first drive input terminal, the second drive input terminal, the third drive input terminal, and the fourth drive input terminal such that:
      a first time delay occurs between delivery of a first transmission signal to the fourth drive input terminal and delivery of a second transmission signal to the third drive input terminal;
      a second time delay occurs between delivery of the second transmission signal to the third drive input terminal and delivery of a third transmission signal to the second drive input terminal; and
      a third time delay occurs between delivery of the third transmission signal to the third drive input terminal and delivery of a fourth transmission signal to the first drive input terminal.

18. The apparatus of claim 13, further including a third pixel set, wherein:
   the superpixel region includes nine pixels arranged along orthogonal rows and columns so as to form a square;
   the first pixel set includes one center pixel;
   the second pixel set includes four pixels, each disposed in the outer portion of the superpixel region approximately equidistant from the center pixel; and
   the third pixel set includes four pixels, each disposed in the outer portion of the superpixel region approximately equidistant from the center pixel at a greater distance from the center pixel than each pixel of the second pixel set.

19. The apparatus of claim 13, further comprising a platen and an acoustic coupling medium disposed above the array, wherein the array is configured to receive or transmit ultrasonic signals through the platen and the coupling medium.

20. A non-transitory computer readable medium having software stored thereon, the software including instructions for causing an apparatus to:
   operate an array of piezoelectric ultrasonic transducer elements in a selectable one of a first mode and a second mode, the array including a plurality of superpixel regions, each superpixel region including at least two pixel sets, a first pixel set of the at least two pixel sets being disposed in a central portion of the superpixel region, and at least a second pixel set being disposed in an outer portion of the superpixel region, the array having an electrical coupling with transceiver electronics; wherein
      in the first mode, the array generates a substantially plane ultrasonic wave having a first acoustic pressure; and
      in the second mode, the array generates, from each superpixel region, a focused beam having a second acoustic pressure that is substantially higher than the first acoustic pressure;
   the superpixel region includes seven pixels arranged on a hexagonal lattice so as to form a hexagon;
   the first pixel set includes one center pixel disposed proximate to a center of the hexagon;
   the second pixel set includes six pixels, each disposed in the outer portion of the superpixel region approximately equidistant from the center pixel;
   the electrical coupling between the transceiver electronics and the array includes a first fixedly configured conductive path connecting pixels in the first pixel set with a first drive input terminal and a second fixedly configured conductive path connecting pixels in the second pixel set with a second drive input terminal, the first drive input terminal and the second drive input terminal being coupled with the transceiver electronics; and
   the first pixel set is actuated separately from the second pixel set with a transmission signal having a controllable phase and/or time delay.

21. The computer readable medium of claim 20, wherein:
   in the first mode, the transceiver electronics concurrently transmits signals to each of the first drive input terminal and the second drive input terminal; and
   in the second mode, the transceiver electronics sequentially transmits signals to each of the first drive input terminal and the second drive input terminal such that a time delay occurs between delivery of a first transmission signal to the second drive input terminal and delivery of a second transmission signal to the first drive input terminal.

22. The computer readable medium of claim 20, wherein:
   the superpixel region includes a third pixel set and nine pixels arranged along orthogonal rows and columns so as to form a square;
   the first pixel set includes one center pixel;
   the second pixel set includes four pixels, each disposed in the outer portion of the superpixel region approximately equidistant from the center pixel; and
   the third pixel set includes four pixels, each disposed in the outer portion of the superpixel region approximately equidistant from the center pixel, at a greater distance from the center pixel than each pixel of the second pixel set.

* * * * *